United States Patent [19]
Mansfield

[11] Patent Number: 4,588,948
[45] Date of Patent: May 13, 1986

[54] NUCLEAR MAGNETIC RESONANCE METHODS

[76] Inventor: Peter Mansfield, 15 Devonshire Avenue, Beeston, Nottingham, England

[21] Appl. No.: 538,977

[22] Filed: Oct. 4, 1983

[30] Foreign Application Priority Data

Oct. 6, 1982 [GB] United Kingdom ............... 8228567

[51] Int. Cl.$^4$ .......................................... G01R 33/22
[52] U.S. Cl. ................................. 324/309; 324/311
[58] Field of Search ....................... 324/307, 309, 311

[56] References Cited

U.S. PATENT DOCUMENTS

| 4,021,726 | 3/1977 | Garroway ............................ 324/309 |
| 4,115,730 | 9/1978 | Mansfield ............................ 324/309 |
| 4,290,019 | 9/1981 | Hutchinson ......................... 324/309 |
| 4,318,043 | 3/1982 | Crooks ................................. 324/309 |
| 4,339,716 | 7/1982 | Young .................................. 324/311 |
| 4,361,807 | 11/1982 | Burl .................................... 324/309 |
| 4,509,015 | 4/1985 | Ordidge .............................. 324/307 |

FOREIGN PATENT DOCUMENTS

| 24640 | 3/1981 | European Pat. Off. ............ 324/307 |
| 76054 | 9/1982 | European Pat. Off. ............ 324/307 |
| 2920549 | 12/1980 | Fed. Rep. of Germany ...... 324/307 |
| 1580787 | 12/1980 | United Kingdom ............... 324/309 |
| 2057142 | 3/1981 | United Kingdom ............... 324/309 |
| 1596160 | 8/1981 | United Kingdom ............... 324/309 |
| 2079463 | 1/1982 | United Kingdom ............... 324/307 |
| 2107469 | 3/1983 | United Kingdom ............... 324/307 |

Primary Examiner—Reinhard J. Eisenzopf
Assistant Examiner—G. Peterkin
Attorney, Agent, or Firm—Watts, Hoffmann, Fisher & Heinke Co.

[57] ABSTRACT

A method of investigating a body by nuclear magnetic resonance comprising preferentially exciting resonance in a slice of the body, applying a magnetic field to the body having first and second gradients (Gx, Gy) in different directions in the slice with both the gradients being periodically reversed at regular intervals, detecting the free induction decay signals occurring when the gradients are applied and processing the detected signals to retrieve data. The method is an adaptation of the echo-planar technique suitable for obtaining chemical shift information.

5 Claims, 38 Drawing Figures

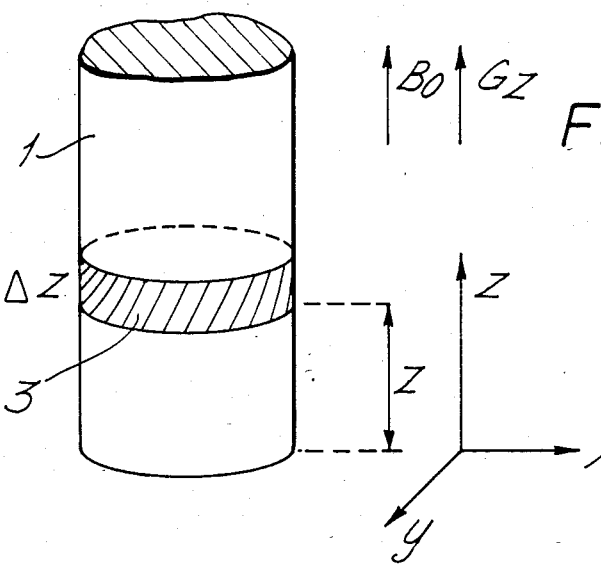
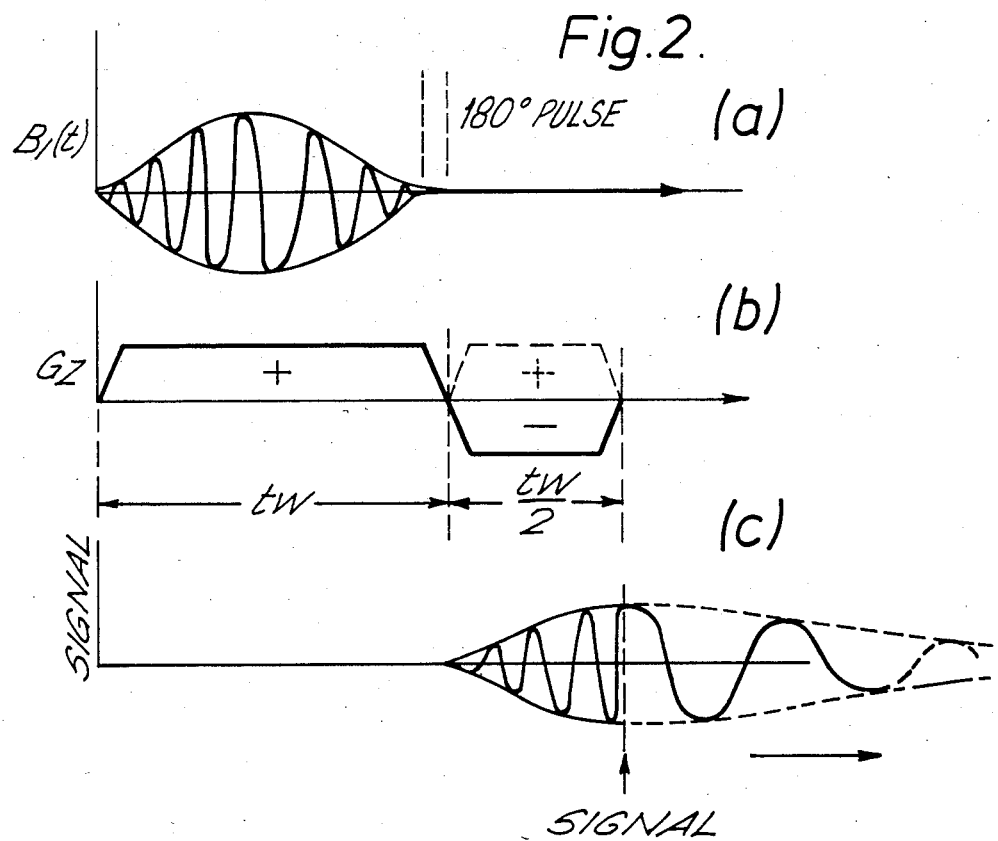

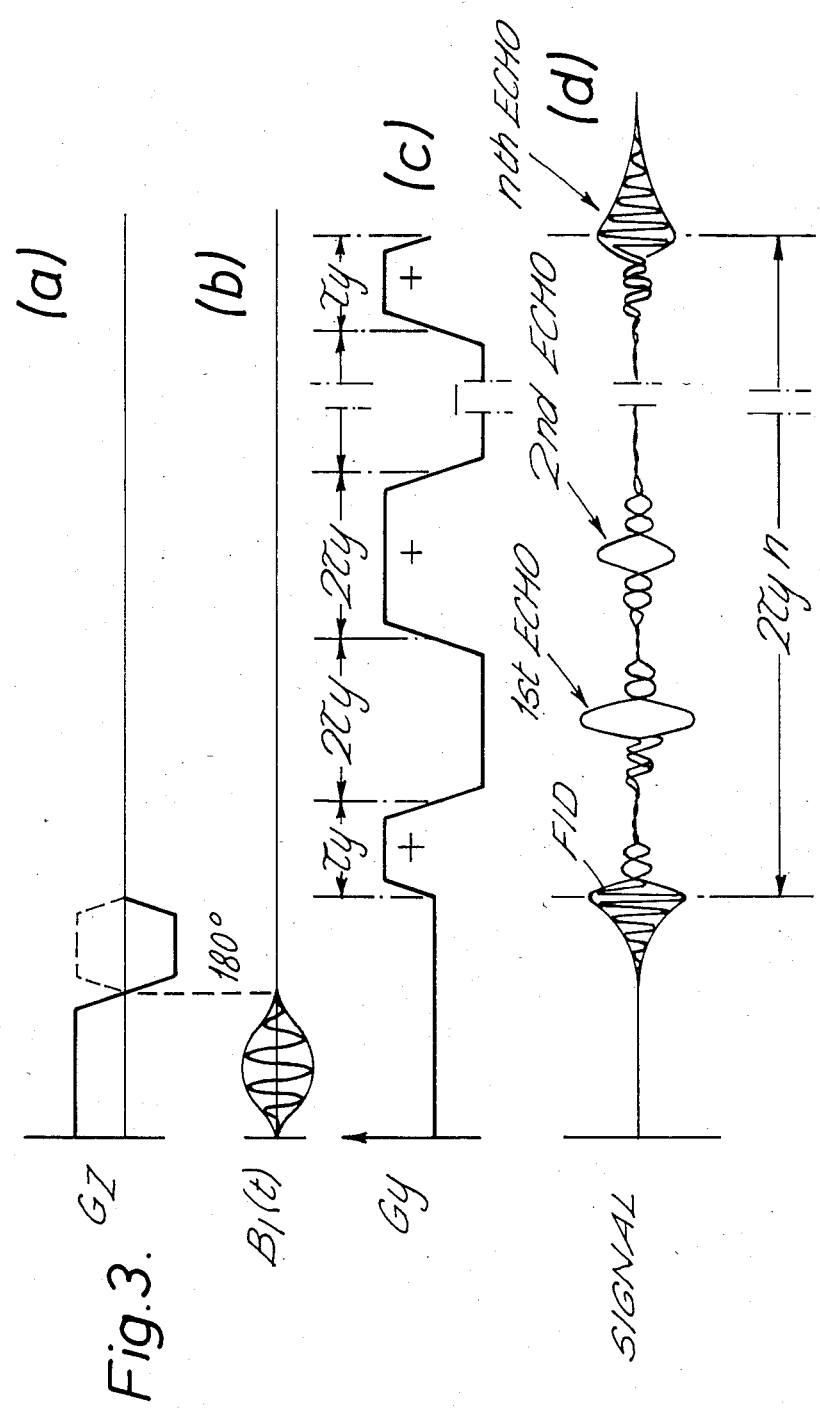

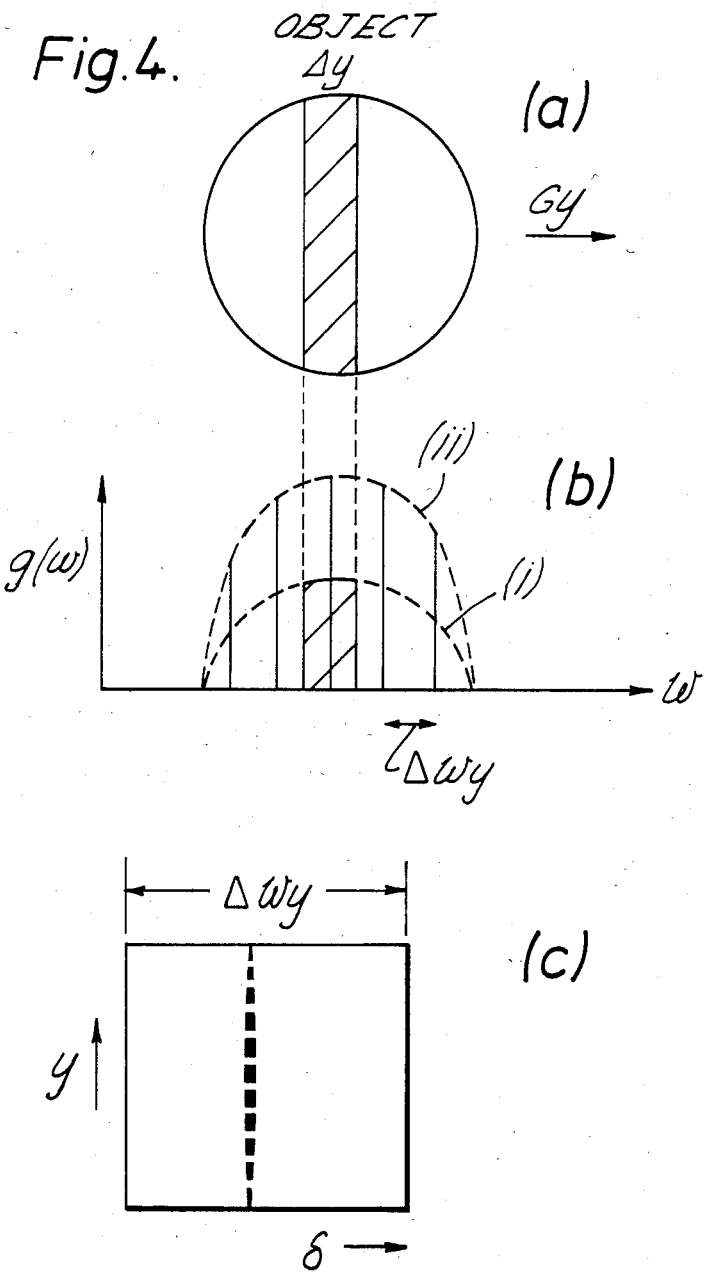

Fig.6
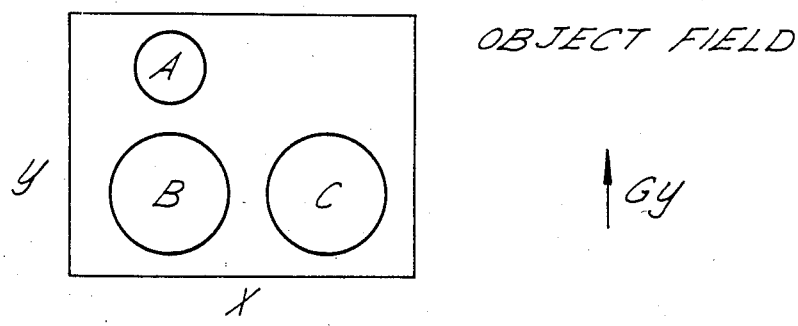
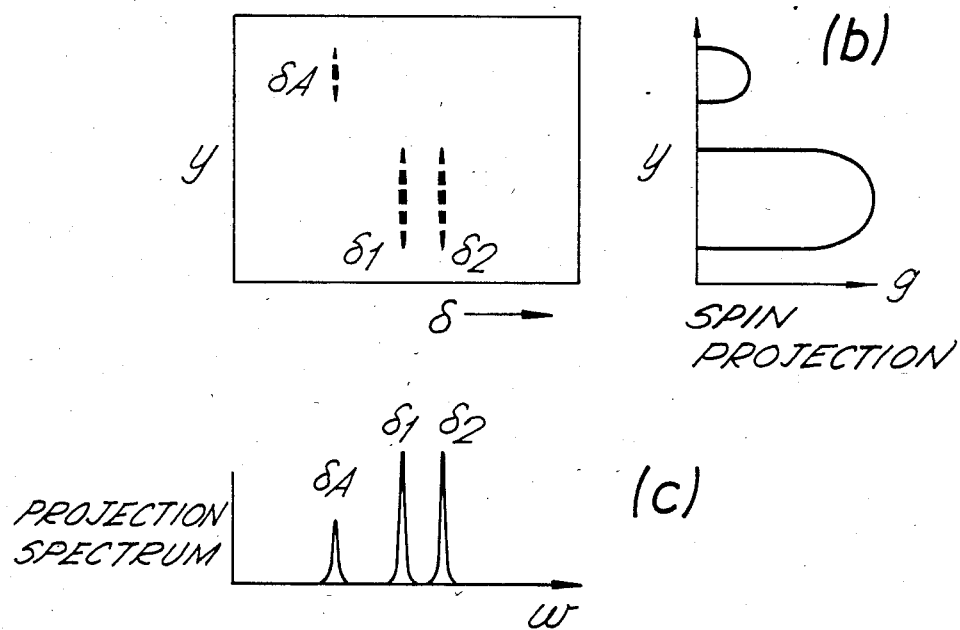

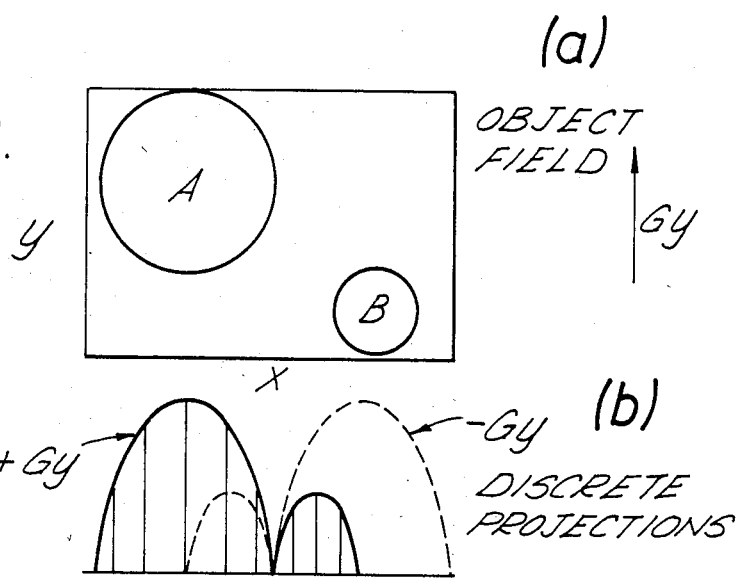
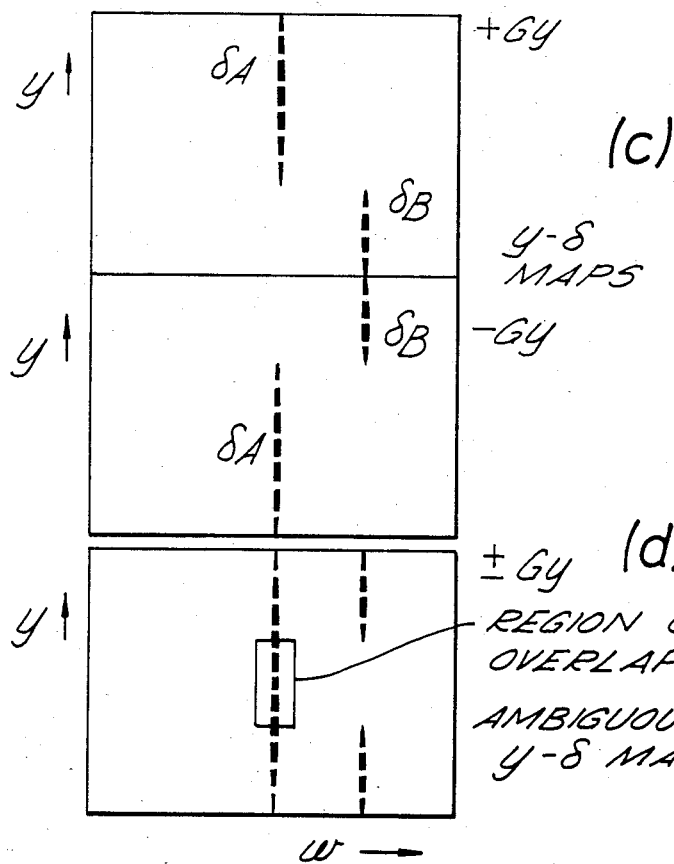
Fig.9.

NUCLEAR MAGNETIC RESONANCE METHODS

This invention relates to methods of investigating a body by nuclear magnetic resonance (NMR).

Over the last several years considerable interest has been generated in the subject of NMR imaging. The major effort in this field has been devoted to spin density and relaxation time imaging in two and three dimensions in biomedical, plant and other systems.

A further NMR parameter in which interest has grown rapidly over recent years is chemical shift. In variants of the projection reconstruction NMR imaging technique, it is, in principle, possible to obtain sufficient information to construct a two dimensional chemical shift map, with corresponding image of the object. However, this process may be somewhat lengthy and tedious.

It is an object of the present invention to provide an echo planar (EP) NMR method or variant EP method suitable for obtaining spatial chemical shift information.

According to the present invention a method of investigating a body by NMR comprises: preferentially exciting resonance in a slice of the body; applying a magnetic field to said body having first and second gradients in different directions in said slice, both said gradients being periodically reversed at regular intervals; detecting the free induction decay signals occurring when said gradients are applied; and processing the detected signals to retrieve data.

In a preferred method in accordance with the invention during the detection of the free induction decay signals the phase of the reversal of one of said gradients with respect to the reversal of the other gradients is reversed.

The invention further provides a method of investigating a body by NMR comprising performing the method according to the invention twice with at least one of the gradients starting in the second performance with opposite polarity with respect to the first performance.

The invention will now be further explained and one method in accordance with the invention described by way of example, with reference to the accompanying drawings in which:

FIG. 1 is a diagram illustrating the preferential excitation of nuclear magnetic resonance in a slice of a body;

FIGS. 2a to 2c illustrate the applied fields and resulting signal during the excitation procedure of FIG. 1;

FIGS 3a to 3d illustrate the applied fields and signals during a conventional one dimensional EP NMR imaging method;

FIGS. 4a, 4b and 4c illustrate the data obtained during a first experiment using the method of FIG. 3;

FIGS. 6a, 6b and 6c illustrate the data obtained during a third experiment using the method of FIG. 3.

FIGS. 9a to 9d illustrate the data obtained during an experiment using the method of FIG. 7;

Figure 11:
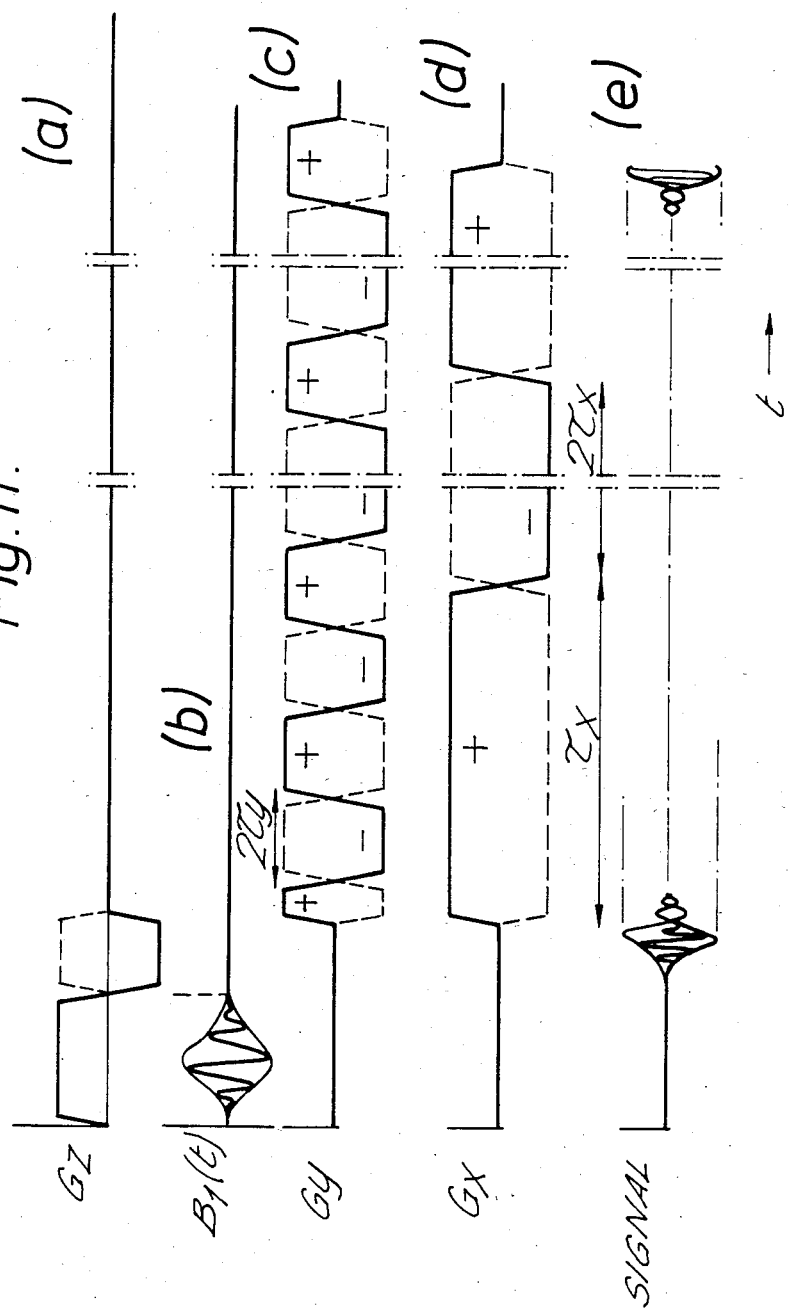
FIGS. 11a to 11e illustrate the applied field and resulting signals during an NMR imaging method in accordance with the present invention.
Figure 13:
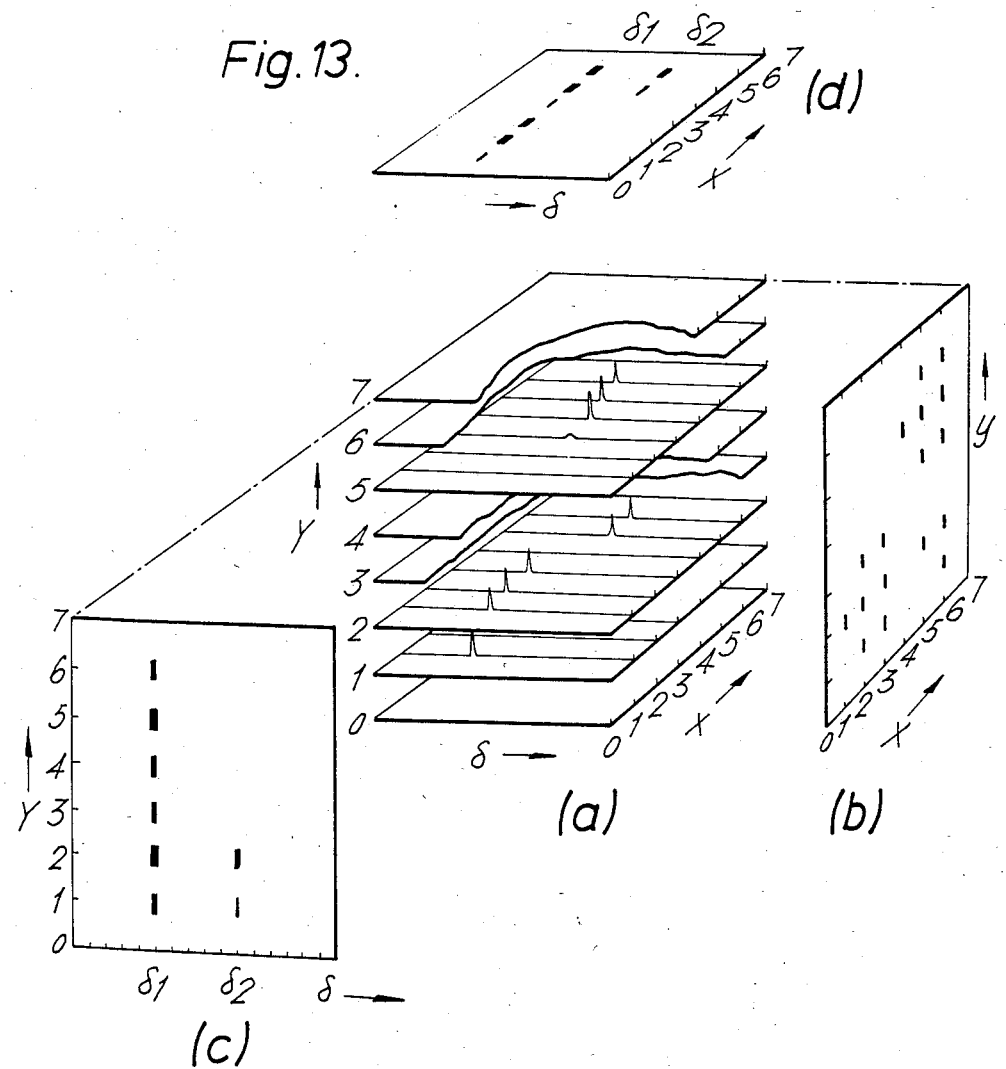

FIG. 13 further illustrates the data obtained during an experiment using the method of FIG. 11.

Referring to FIG. 1, consider an extended body 1 placed in a polarizing magnetic field $B_o$ and a magnetic field gradient $G_z$. As illustrated, in FIG. 2, such a system may be irradiated with a tailored selective RF pulse $B_1(t)$ applied along the x-axis in the rotating reference frame so as to excite preferentially those spins which lie in a slice 3 of the body (shaded) of thickness $\Delta z$ at displacement z. The corresponding range of Larmor frequencies excited is given approximately by $$\Delta \omega_z = \gamma G_z \Delta_z \qquad (1)$$

where $\Delta$ is the magneto-gyric ratio of the particular spin species considered. It is approximate in the sense that such tailored pulses automatically introduce some dispersive element of magnetization. In our case for example, we wish to produce a net magnetization along the y-axis with, ideally, zero magnetization along both the positive and negative x-axes. This situation may be approached by using a so-called focussed selective pulse in which the select gradient $G_z$ (FIG. 2b) is temporarily reversed following excitation. Alternatively the selective excitation pulse may be followed by a nonselective 180° RF pulse and a $G_z$ gradient pulse of the same polarity as selective excitation pulse gradient as shown dotted in FIGS. 2a and 2b. This produces an echo-like signal (FIG. 2c) which maximizes at time 3/2 $t_w$ where $t_w$ is the RF pulse length. This is the case when $|G_z|$ is constant. The unwanted x-component of signal may be minimized by subtle changes in the RF pulse shape. Since selection does not unduly perturb adjacent layers of material, rapid scanning of several layers may be achieved without the necessity of waiting $T_1$, the spin lattice relaxation time, between different plane scans.

One dimensional mapping of the data contained in the signal of FIG. 2c may be achieved by a conventional EP imaging procedure as illustrated in FIG. 3.

FIGS. 3a and 3b show the slice selection procedure described above with reference to FIG. 2 together with an additional y-gradient ($G_y$) modulation (FIG. 3c), commenced at the focussed signal peak, the x-directional gradient ($G_x$) being zero and therefore not shown. $G_y$ is trapezoidally modulated (ideally rectangular) and in a perfectly homogeneous static magnetic field $B_o$ produces an initial FID followed by a sequence of modified spin echoes $2n\tau_y < T_2$ where $T_2$ is the spin-spin relaxation time. This part of the procedure is identical to a standard alignment procedure in EP imaging. Indeed, if the body 1 is a homogeneous cylinder of material of a single chemically shifted species then the selected slice of material, FIG. 4a, is a homogeneous disc. The spin projection of this disc in a static gradient $G_y$ gives a semi-elliptic absorption line shape $g(\omega)$(dotted FIG. 4b). This is obtained by sampling just the initial FID. Tne effect of sampling the complete spin echo sequence of FIG. 3d and Fourier transforming is to convert the continuous projection profile (dotted) into the discrete stick spectrum, FIG. 4b. The stick spacing $\Delta \omega_y$ is related to the spin echo period $2\tau$ and the number of data sample points P with sampling time $\tau_o$ by the following relationships $$2\pi/P\tau_o = \Delta\omega_p \qquad (2)$$

where $\Delta\omega_p$ is the angular frequency per point in the Fourier transform (FT) and $$n\Delta\omega_p = \Delta\omega_y = \frac{2\pi}{2\tau} = \frac{2\pi n}{P\tau_o}. \qquad (3)$$

This assumes that odd and even echoes are equivalent. The situation when this is not the case is discussed more fully later.

The process of converting the continuous projection profile into a stick spectrum effectively squeezes signals obtained from the continuous spectrum in the range $\Delta\omega_y$ (that is to say, the area under the profile) into a single frequency stick, with equal area and centred within the frequency element.

This bunching together of data gives an improved signal/noise ratio (S/N) for the stick spectrum. The total signal intensity arises from corresponding obJect strips of width $\Delta y$ (shaded) in FIG. 4a.

If the data of FIG. 4b are reordered into a matrix array, a hybrid "image" is obtained in which the vertical axis is the y coordinate and the horizontal axis is angular frequency, here labelled for convenience as $\delta$. That is to say, in standard EP alignment procedure there is a space versus frequency plot of an excited slice within a continuous specimen. Each point in the y-$\delta$ map has the same $\delta$ shift (i.e. vertical lines or streaks), but streak intensity may vary (height of the stick spectra), because we have considered so far a specimen with just one spin species having one value of $\gamma$. However, when we have a sample with several spin species, or more practically, one species with several different chemical environments giving rise to several chemically shifted spin sites, then provided they are all excited in the initial selective excitation sequence, these chemically shifted nuclei will give rise to several frequencies which will appear in the FT spectrum. However, there is another important proviso or condition referred to later which must be fulfilled, even for this rather limited y-$\delta$ plot to be achieved in practice.

Figure 5:
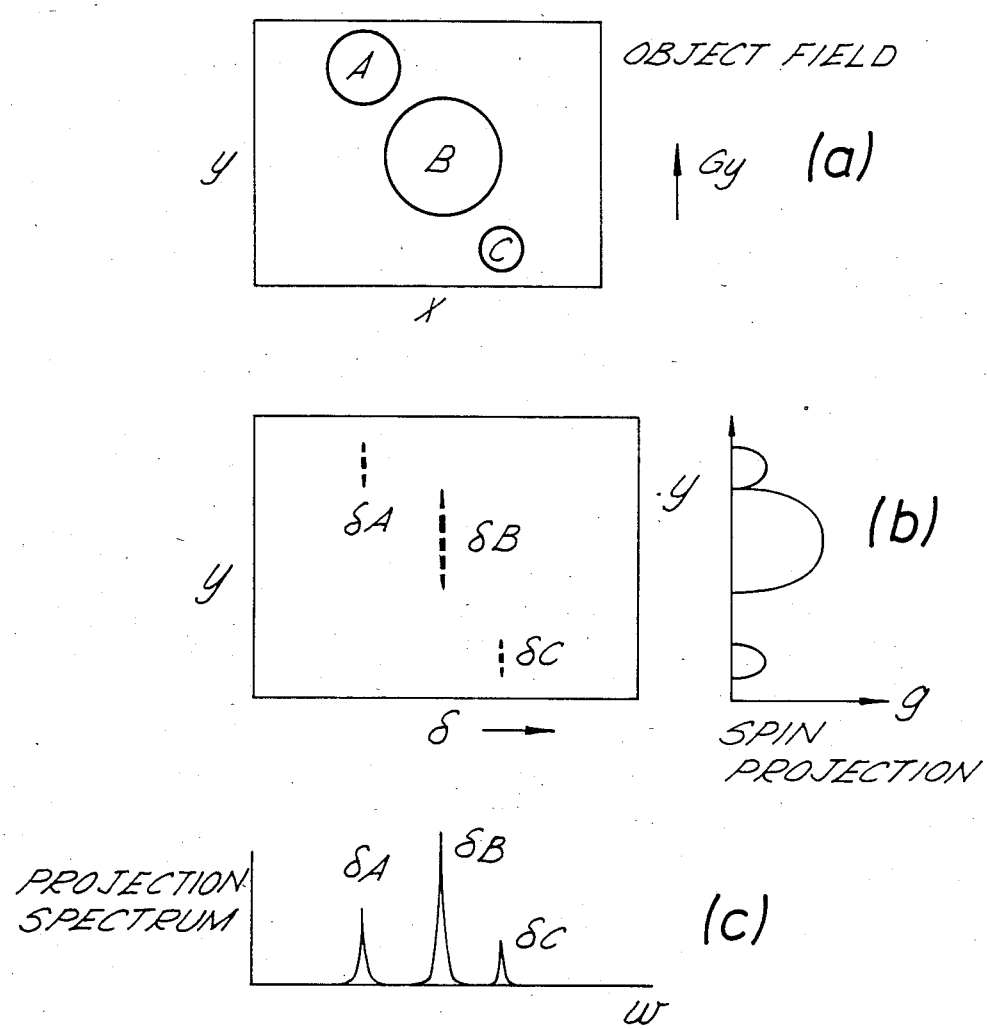
FIGS. 5a, 5b and 5c illustrate the data obtained during a second experiment using the method of FIG. 3.

Use of the above described procedure to investigate a specimen as shown in FIG. 5a which comprises three tubes A, B and C each containing material of different chemical shift, $\delta_A$, $\delta_B$ and $\delta_C$ will now be considered. As shown, the tubes are separated along the y-axis and therefore the chemical shift map and its projection spectrum can be unambiguously assigned. That is to say, the signal from tube A can be unambiguously assigned to the absorption peak $\delta_A$, FIG. 5c, via the y-$\delta$ plot of FIG. 5b. In this case the encoding is achieved entirely by $G_y$ and by appropriately placing the tubes with y displacements so that no overlap occurs.

However, in more general specimens, where the chemically shifted species are not so conveniently spaced, unambiguous assignment of spectra can be very difficult, if not impossible. As a simple illustration of this point, consider the specimen of FIG. 6a, which again comprises three tubes A, B and C containing material with respective chemical shifts $\delta_A$, $\delta_B$ and $\delta_C$. In this example, tube A is well displaced from the other tubes along the y-axis. Tubes B and C are the same size their centres having the same y coordinate. These tubes are therefore not separated along the y-axis. The y-$\delta$ map FIG. 6b, again has three streaks but only $\delta_A$ can be unambiguously assigned. Without knowing beforehand, there is insufficient information to decide whether $\delta_1$ belongs to tube A or B. Therefore the projection spectrum, FIG. 6c is ambiguous.

Reference is made above to a condition which is a prerequisite to make even the above described y-$\delta$ mapping work. Before broadening the discussion to full two dimensional mapping the basic assumptions of FIG. 3 must be examined. In that case a homogeneous cylinder of spins with one Larmor frequency only was considered. In this special case Fourier transformation of the spin echo sequence gives the stick spectrum as described provided that the disc of material is centrally placed in the object field. For in this case, the spin projection profile of the object is the same in both $+G_y$ and $-G_y$. However, for a general non-homogeneous and irregularly shaped object, which is arbitrarily placed in the object field, the projection in $+G_y$ is not the same as that in $-G_y$. They are mirror images. This means that above experiments with various tubes and chemical shifts will not work as described. Modifications to overcome this problem are next discussed.

Experiments will now be described which overcome the above raised obJections and allow one dimensional mapping of an arbitrary object with $\delta$ shifted regions. It is emphasized that these experiments will not give unambiguous chemical shift assignments to the object unless the chemically shifted regions are well spaced so as not to overlap along one axis (the y-axis, for example).

Figure 7:
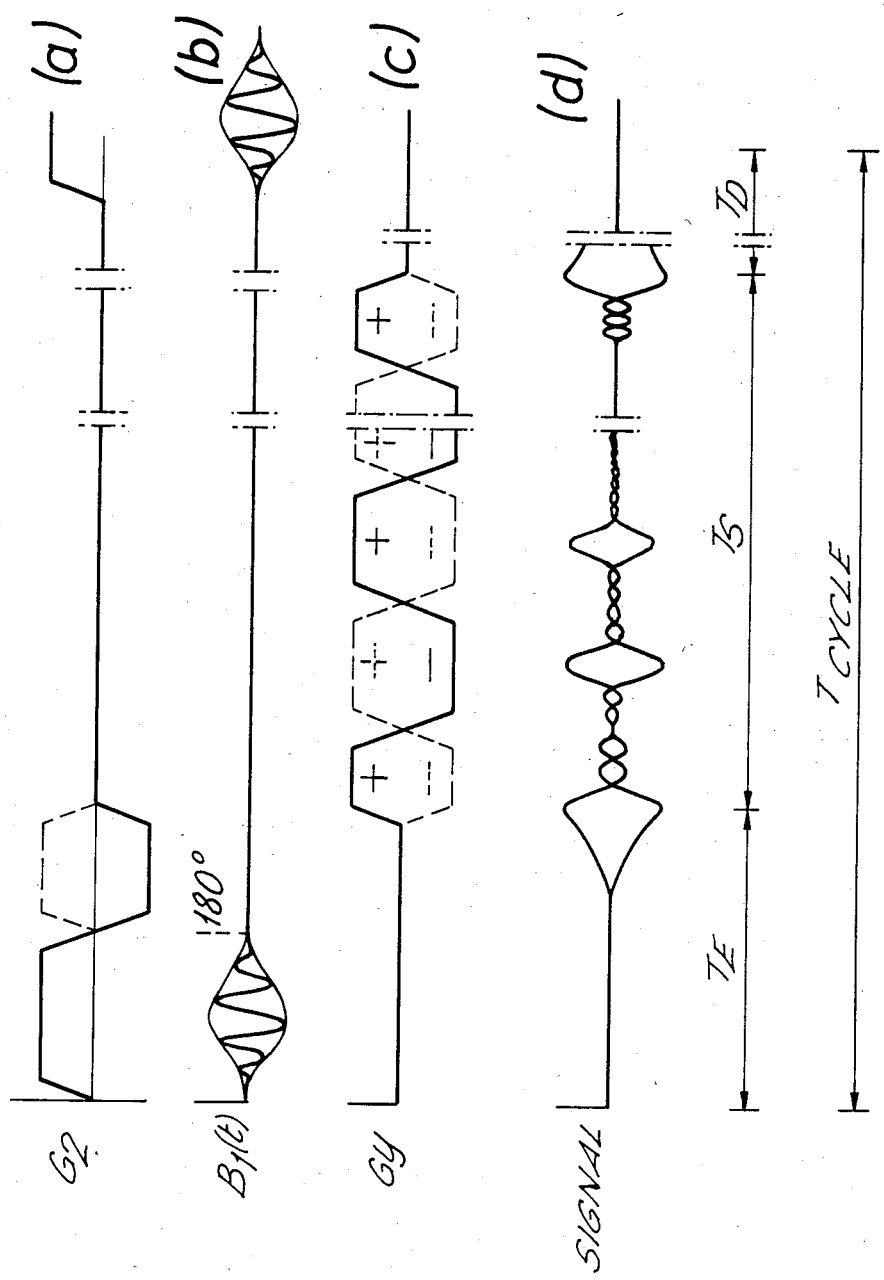
FIGS. 7a to 7d illustrate the applied fields and resulting signals during a further one dimensional EP NMR imaging method.

To overcome the above-mentioned mirror reflection problem and also spatial resolution problems, two methods are proposed. In the first method, FIG. 7, slice selection in period $T_E$ (FIGS. 7a, 7b) is followed by $G_y$ modulation (FIG. 7c) and complete signal and echo sampling in time $T_S$ (FIG. 7d), which in turn is followed by a delay period $T_D$. The experimental cycle time $T_C$ is therefore given by $$T_C = T_E + T_S + T_D \qquad (4)$$

Figure 8:
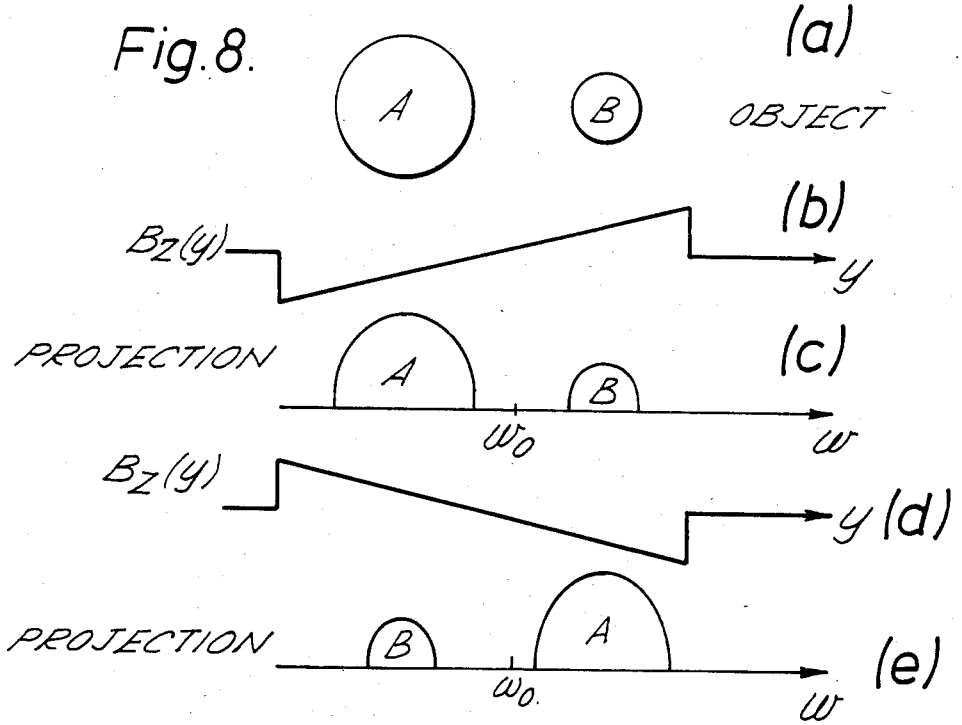
FIGS. 8a, 8b and 8c illustrate a feature of the processing of the data obtained in the method of FIG. 3.

In odd cycles, the phase of $G_y$ starts positively shown by the solid line of FIG. 7c. However, in even cycles, the $G_y$ phase starts negatively, as indicated by the dotted line of FIG. 7c. Successive odd and even signals are then first edited in the time domain by splicing from both signal trains all echoes formed in positive gradients. Likewise, an all negative gradient signal may be formed. Both spliced signals are now Fourier transformed to yield two separate stick profiles, one formed wholly in $+G_y$, the other in $-G_y$. These spectra are mirror images of each other and must be reordered in the frequency domain before co-adding to give S/N improvement. This procedure is clarified by reference to FIG. 8 which shows two discs (FIG. 8a) and their respective projections FIGS. 8c and 8e in a $\pm y$ gradients (FIGS. 8b and FIGS. 8d). If the wholly positive data are not sorted out from the negative data as described above or by other means, there is image overlap, even with one homogeneous disc of material characterized by one $\delta$, should the disc be off centre in the object field.

As an example of expected y-$\delta$ maps, consider FIG. 9a in which the specimen comprises two discs A and B with chemical shifts $\delta_A$ and $\delta_B$ respectively. FIG. 9b shows the stick projection spectra in both $+G_y$ (solid) and $-G_y$ (dotted). The separated y-$\delta$ maps are shown in FIG. 9c and are assignable. But the map obtained without performing the double shot experiment and subsequent editing and splicing procedure discussed above leads to a y-δ map which overlaps along the y-axis (see FIG. 9d) through two causes. The first is an aliasing like effect when one or more of the specimens fills more than half the object field along the y direction. The second effect, more subtle, arises through a resolution loss along the y-direction due to a discontinuity of the echo evolution in alternate positive or negative gradients. It results in a fuzziness of the streak edges over several pixels along the y-axis, and it too can lead to undesirable streak overlap with consequent ambiguity in assignment. Although the $\delta_A$ and $\delta_B$ lines in the example are resolved along the frequency axis, there are in fact four streaks, two of which overlap. Such a y-δ map cannot lead to a completely unambiguous assignment, especially when dealing with the general case of continuously distributed spin systems encountered in biological specimens.

The $G_y$ phase alternated sequence described above is really a two shot experiment with $T_D$ between shots. This is a perfectly satisfactory method of chemical shift mapping when time is not of primary concern. However, if a complete one shot experiment is necessary, it is straightforward to combine the two phases of the experiment into a single experiment in which $T_D$ is effectively zero between phase alternated pairs. In this case the first and second selective RF pulses must have nutation or flip angles of 45° and 90° respectively. Other combinations of lower flip angle are also possible.

The discreteness arising from the periodic nature of the spin echo formation places constraints on the frequency range $\Delta\omega_y$ in each line of the y-δ plot, if wraparound (aliasing) and possible overlap of the chemically shifted species present is to be avoided. The largest chemical shift difference must satisfy the condition that $$\delta_{max} < \frac{\Delta\omega_y}{\omega_o}. \tag{5}$$

In this inequality is violated, large positively or negatively chemically shifted lines can move out of one line of the y-δ map and appear in an adjacent line, above or below as an apparent negative or positive shift, producing the above-mentioned wraparound effect. If such aliased lines happen to coincide with genuine lines, separation becomes difficult if not impossible.

It is emphasized again that y-δ mapping is only of limited usefulness. In FIG. 6a there is demonstrated the problem of ambiguity which arises when chemically shifted species have the same y coordinates. Another way of overcoming this problem is to view the object from various projection directions and thereby resolve the chemical shift information in the plane. This approach may well be useful, since each projection if performed as described above, yields a y-δ map and such a set of maps contains all the requisite inrormation to reconstruct an x, y-δ by standard filtered back projection methods.

There will now be described a method in accordance with the invention for obtaining full two dimensional chemical shift spectra, without recourse to image reconstruction from a projection set.

Encoding along the x-axis is achieved by applying an additional $G_y$ gradient as well as the $G_y$ gradient already described. The process is similar to EP imaging and for proper interpretation of the shift spectra corresponding spin density images are required. However, as explained later, full spin information including the spin density images are automatically available by the method described.

In order to fully understand the three dimensional (x,y,δ) mapping process, we first consider the theoretical basis for EP imaging and then introduce the necessary modifications permitting mapping of δ(x,y,z).

Initial excitation of the spin system may be by using a non-selective pulse to excite all spins within the transmitter coil volume. In this case, we would produce a 4-dimensional map (x,y,z,δ). This is clearly possible from a theoretical point of view and in this case the FID signal in the rotating reference frame at time t following the pulse is given by $$S(t) = r \cdot p \cdot \iiint \rho(x,y,z) \exp\left[ i\gamma \int_0^t (xG_x(t') + yG_y(t') + zG_z(t'))dt' \right] dxdydz \tag{6}$$

Where $\rho(x,y,z)$ is the spin density, $\gamma$ the magneto-gyric ratio, here considered the same for all spins, $G_x(t')$, $G_y(t')$ and $G_z(t')$ are linear time dependent field gradients. The time dependence for chemical shift mapping is preferably trapezoidal, although other time dependencies can be accommodated with appropriate non-linear transformation or non-linear sampling and FT with appropriate correction for the non-linearities introduced by sampling.

Full 4-dimensional mapping will be technically difficult to perform and in view of the large data handling and storage problem may be even undesirable. For this reason, we shall restrict the discussion to three-dimensional mapping, i.e. production of x,y-δ maps. In this case Equation (6) can be reduced to $$S(t) = r \cdot p \cdot \iint \rho(x,y,z) \exp\left[ i\gamma \int_0^t (xG_x(t') + yG_y(t'))dt' \right] dxdydz \tag{7}$$

where we assume that the initial excitation RF pulse is selective to a plane z. For a finite slice thickness $\Delta z$, we shall assume that the spin density over a selected slice does not change significantly over the slice thickness and may therefore be replaced by an average spin density over z given by $$\int^{z + \Delta z} \rho(x,y,z)dz = \rho_z(x,y)\Delta z \tag{8}$$

where $\rho_z(x,y)$ is the average over the slice lhickness $\Delta z$. This will be true for thin slices. In this case $$S(t) = r \cdot p \cdot \iint \Delta z \, \rho_z(x,y) \exp\left[ i\gamma \int_0^t (xG_x(t') + yG_y(t'))dt' \right] dxdy \tag{9}$$

In certain instances it might be valuable to further select a small area of interest within a chosen slice. This may be achieved by static magnetic field shaping (TMR) or purely by a selective excitation procedure or by a combination of both methods. In any event, the object of such a procedure would be to improve localized pixel resolution without overburdening the data handling capacity of the system. For example, with such tailored sequences, a zoom facility could be constructed to look in finer detail at a single organ like the heart or a kidney without the need to examine the whole body cross-section. This facility would be of value in straight-forward NMR imaging as well as in mapping of other NMR parameters, such as $\delta$, flow, $T_1$, $T_2$, etc.

In normal two dimensional EP imaging, only $G_y(t)$ is a function of time. The so-called read gradient G is usually applied as a single step. In a method according to the present invention $G_x(t)$ is also a periodic function of time. Equation (9) may be written $$S(t) = r \cdot p \cdot \int f(x,t) \exp\left[ i\gamma \int_0^t x G_x(t')dt' \right] dx \tag{10}$$

where $$f(x,t) = \int \Delta z \, \rho_z(x,y) \exp\left[ i\gamma \int_0^t y G_y(t')dt' \right] dy \tag{11}$$

If $G_y(t')$ is periodic modulo $4\tau_y$ then Equation (11) may be written as two expressions $f_1(x,t)$ and $f_2(x,t)$ depending on the starting phase of $G_y(O)$. These expressions are periodic FID's or spin echo trains following an initial FID and are given by $$f_1(x,t) = \sum_{p=0}^{N} g^+(x,(t - 4p\tau_y)) E(t) + \tag{12a}$$

$$\sum_{p=0}^{N-1} g^-(x,(t - 2(2p+1)\tau_y)) [1 - E(t)]$$

for a positive starting phase for $G_y(O)$, and $$f_2(x,t) = \sum_{p=0}^{N} g^-(x,(t - 4p\tau_y)) E(t) + \tag{12b}$$

$$\sum_{p=0}^{N-1} g^+(x,(t - 2(2p+1)p\tau_y)) [1 - E(t)]$$

for a negative starting phase where $E(t)=0,1$ is an editing function which sets all data to zero in the time periods corresponding to the original odd echoes and $g\pm$ describes signal evolution in $+$ve or $-$ve y-gradients only.

Fourier transformation of Equation (12a) gives for large N $$F_1(\omega_x,\omega_y) = \tag{13}$$

$$\sum_{m=-\infty}^{\infty} 2\pi \Delta y \rho_z(m\Delta\omega_y,\omega_x)\{\delta(\omega_y - m\Delta\omega_y) \circledX E(\omega_y) +$$

$$(-1)^m \delta(\omega_y + m\Delta\omega_y) \circledX (\delta(\omega_y) - E(\omega_y))\}$$

where $\delta(\omega_y - m\Delta\omega_y)$ is the Dirac delta function and $\circledX$ denotes convolution with the Fourier transform of the editing function $E(\omega_y)$, etc. The angular frequency element $$\Delta\omega_y = 2\pi/4\tau_y = \gamma \Delta y G_y \tag{14}$$

The element $\Delta y$ is the spatial displacement of the sticks in the spectrum of Equation (13).

It will be noted that splicing the two time functions, Equations (12a and b) can give a related time function which represents evolution of the spin system in either a wholly positive gradient $+G_y(t)$ or a wholly negative gradient $-G_y(t)$. The two related functions are $$f^+(x,t) = \sum_{p=0}^{N} g^+(x,(t - 2p\tau_y)) \tag{15a}$$

$$f^-(x,t) = \sum_{p=0}^{N} g^-(x,(t - 2p\tau_y)) \tag{15b}$$

It will be seen that both new spliced functions are modulo $2\tau_y$. In practice, these generated functions may be obtained by an editing function which appropriately pieces together two echo sequences. Fourier transformation of Equation (15a) gives $$F^+(\omega_x,\omega_y) = \sum_{m=-\infty}^{\infty} 2\pi \Delta y \rho(m\Delta\omega_y,\omega_x)\delta(\omega_y - m\Delta\omega_y) \tag{16}$$

where m is integer, but now $$\Delta\omega_y = 2\pi/2\tau_y = \gamma \Delta y G_y \tag{17}$$

giving a spatial displacement $\Delta y$ double that of Equation (14).

The function $F-$ gives a similar result but since it is produced in $-G_y$, the sumation runs in reverse order, $M=+\infty \to -\infty$ which is equivalent to changing the sign in the delta function of Equation (16) from $-$ to $+$, i.e. $\delta(\omega_y+m\Delta\omega_y)$.

$$f^+(x,t) = \sum_m \int_{-\infty}^{\infty} \Delta y \Delta z \rho_z(m\Delta\omega_y,\omega_x) e^{-i\omega_y t} \delta(\omega_y - m\Delta\omega_y) d\omega_y \tag{18a}$$

$$= \sum_m \Delta y \Delta z \rho_z(m\Delta y,x) e^{im\Delta\omega_y t} \tag{18b}$$

substituting this expression back into Equation (10) we obtain the part spliced function $$S^+(t) = \tag{19a}$$

$$r \cdot p \cdot \sum_m \int \Delta y \Delta z e^{-im\Delta\omega_y t} \rho_z(m\Delta y,x) \exp\left[ i\gamma \int_0^t x G_x(t')dt' \right] dx$$

$$= r \cdot p \cdot \sum_m \Delta y e^{-im\Delta\omega_y t} h(m\Delta y,t) \tag{19b}$$

where $$h(m\Delta y,t) = \int \Delta z \rho_z(m\Delta y,x) \exp\left[ i\gamma \int_0^t x G_x(t')dt' \right] dx \tag{20}$$

Equation (20) describes an FID type signal when $G_y$ is time independent. However, if $G_x(t')$ is periodic modulo $4\tau_x$, we again obtain two related functions of time $h_1(m\Delta y,t)$ and $h_2(m\Delta y,t)$ which describe periodic spin echo sequences in which the initial phase of $G_x(t)$ is positive and negative respectively. As in the case of $f_1$ and $f_2$, $h_1$ and $h_2$ may be spliced to give $h^+(m\Delta y,t)$ and $h^-(m\Delta y,t)$ where $$h^{\pm}(m\Delta y,t) = \sum_{p=0}^{N} k^{\pm}(m\Delta y,(t-2p\tau_x)) \tag{21}$$

where $k^{\pm}$ describes signal evolution in +ve or −ve x-gradients only.

In this arrangement, because of the periodic time dependence introduced through $G_x(t)$, discreteness along x follows automatically. Fourier transformation of $h^+$ for example gives $$H^+(m\Delta\omega,y l\Delta\omega_x) = \sum_{l=-\infty}^{\infty} 2\pi\Delta x\Delta z\rho_z(l\Delta\omega_x, m\Delta\omega_y)\delta(\omega_x - l\Delta\omega_x) \tag{22}$$

where $$\Delta\omega_x = 2\pi/2\tau_x = \gamma\Delta x G_x$$

The function $h^-$ gives on Fourier transformation $H^-$ which is similar to Equation (22).

The inverse transform of Equation (22) gives $h^+$ which when substituted for $h(m\Delta y,t)$ in Equation (19b) gives the fully spliced or edited function $$S^{++}(t) = \sum_{l,m} \Delta v\rho_z(l\Delta x, m\Delta y)\cos(l\Delta\omega_x + m\Delta\omega_y)t \tag{24}$$

where the pixel volume $\Delta v$ is $$\Delta v = \Delta x \Delta y \Delta z \tag{25}$$

It will be apparent from the foregoing analysis that Equation (24) is one of four spliced functions, i.e. $S^{++}$, $S^{+-}$, $S^{-+}$, and $S^{--}$, which may be produced. Each function contains all the spatial information or spin density and by a suitable data reordering process in the frequency domain, these functions may be coadded to improve signal/noise. In the following discussion, we shall simply consider $S^{++}$.

Figure 10:
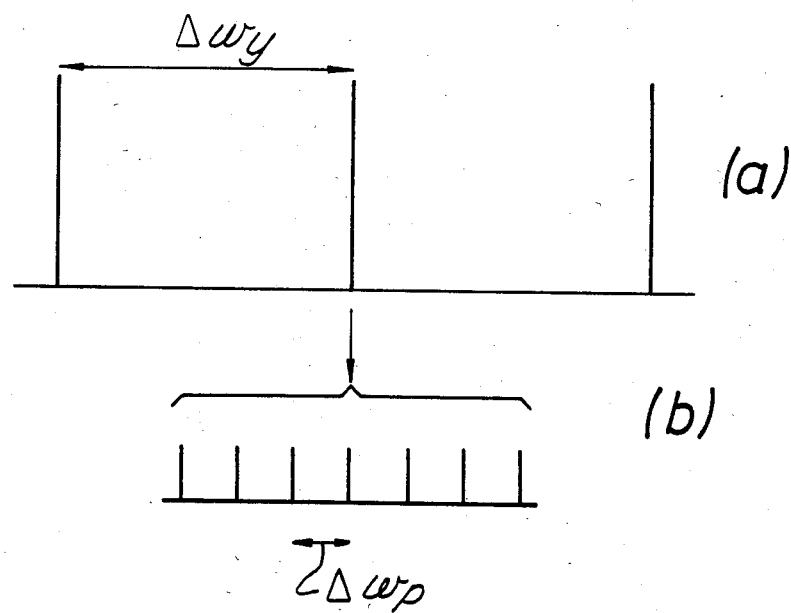
FIG. 10 illustrates a feature of the method according to the present invention.

The effect of modulating $G_x$, here assumed to be at a lower modulation frequency (longer period for square wave modulation) in addition to modulating $G_y$ is to produce a slow amplitude modulation of the faster spin echoes produced in $G_y(t)$. This additioal modulation splits the stick spectra in $G_y$ into multiplets, as shown in FIG. 10. (A constant broadening gradient $G_x$) broadens the sticks as in the usual EP experiment). For non-overlap of the spectral components we require $$\Delta\omega_y = L\Delta\omega_x \tag{26}$$

where L here and M below are integers and are the largest values of l and m in equation (24) which span the sample. In addition, the total number of frequeny points in the spectrum $$P = LMN \tag{27}$$

where N is the number of points between the $G_x$ split sticks. The relationship between L, M and N and the spectral splittings may be more clearly seen as follows. Let $\Delta\omega_p$ be the frequency per point of the FT. Then $$N\Delta\omega_p = \Delta\omega_x \tag{28}$$

From the above we see also that $$\Delta\omega_p P = M\Delta\omega_y \tag{29a}$$

$$= LM\Delta\omega_x \tag{29b}$$

$$= LMN\Delta\omega_p \tag{29c}$$

We also note that $$\Delta\omega_p = 2\pi/T_S \tag{30}$$

where $T_S$ is the time the experiment lasts and corresponds to the echo train length and total sampling time of the echo sequence. Thus $$T_S = 2\tau_x N \tag{31a}$$

$$= 2\tau_y LN \tag{31b}$$

$$= 2\tau LMN \tag{31c}$$

$$= 2\tau P \tag{31d}$$

where Equation (31d) applies for a real point FT (2N→N). (For a complex FT (N→N) $T_S = P\tau = LMN\tau$).

All calculations so far are performed in the rotating reference frame which rotates at $\omega_o$ or at some fixed offset $\Delta\Omega$ from $\omega_o$. Following focussed selective excitation, it is assumed for simplicity that the signal comprises a number of isochromatic components, the frequency spread of which are small compared with the slice width in appropriate frequency units. At the start of this EP modification, therefore, it is assumed that all components of our chemically shifted spin system are in phase. Any phase deviations will appear as a FID amplitude loss at this point. Chemically shifted regions will introduce an additional frequency dependence into Equation (9) which will itself reflect a spatial dependence. Thus the FID and response Equation (9) becomes $$S(t) = r \cdot p \cdot \int\int \Delta z \rho_z(x,y) e^{i\delta(x,y)t} \exp\left[ i\gamma \int_0^t (xG_x(t') + yG_y(t'))dt' \right] dx\,dy \tag{32}$$

In fact, although $\delta(x,y)$ is a continuous function of the position coordinates, it is convenient to break down the integral to a discrete sum of common chemical shifts, localized at specific parts of the objected. The total chemically shifted distribution may be represented as weighted sum of shift components, i.e.

$$\sum_j \rho_z^j(x,y) e^{i\delta_j(x,y)t}$$

In this case, our previous result for the fully spliced response function Equation (24) is easily generalized for j chemically shifted regions, to give $$S^{++}(t) = \sum_j \sum_{l,m} \Delta v \rho_j(l\Delta x, m\Delta y)\cos[l\Delta\omega_x + m\Delta\omega_y + \delta_j(l\Delta x, m\Delta y)]t \quad (33)$$

which by introducing more compact notation may conveniently be written as $$S^{++}(t) = \sum_j \sum_{l,m} \Delta v \rho^j_{lm}(z)\cos(l\Delta\omega_x + m\Delta\omega_y + \delta^j_{lm})t. \quad (34)$$

That is to say a $\delta_{l,m}{}^j$ component introduces a common frequency shift $\delta^j$ for all regions containing that shift. The actual positions of the shifted regions are mapped by the gradients together with the density function $\rho_{lm}{}^j(z)$.

We also see from Equation (34) that for full unambiguous assignment of $\delta_{lm}{}^j$ (no overlap or wraparound) we require $$\Delta\omega_y = L\Delta\omega_x = LN\Delta\omega_p \quad (35)$$

and $$N\Delta\omega_p \geq \delta_{lm}{}^j \quad (36)$$

where L and N are as defined previously.

The complete procedure in one method according to the invention will now be described with reference to FIG. 11.

Slice selection (FIGS. 11a and 11b) is achieved as described above.

FIGS. 11d and 11c respectively show the modulation diagrams for $G_x$ and $G_y$ which may be used in practice. Experimental difficulty will arise due to $G_x$ switching at an echo peak, but since the signal is likely to be quite small here anyway, editing these echoes may not be too troublesome.

In this example L=M=8 and N=16, giving P=1024. This means that the spatial part or image field is described by an 8×8 matrix while the δ dimension has 16 points. Let the experiment last 64 msec taking in 2048 (or 1024) time data points, half of which are zero filled in the FT. From equations (31) above, $2\tau_x = T_S/N = 4.0$ msec and $2\tau_y = T_S/LN = 0.5$ msec. The FT produces 1024 frequency points each with $\Delta\omega_p/2\pi = 16$ Hz/point. At 940 G the Larmor frequency is 4.0 MHz. The point shift therefore, corresponds to 4 p.p.m. The total span of chemical shifts observable in this experiment without overlap or wraparound is therefore 16×4=64 p.p.m. Materials must therefore be chosen such that their natural frequency spread does not exceed 64 p.p.m. (see Equation (35)).

Figure 12:
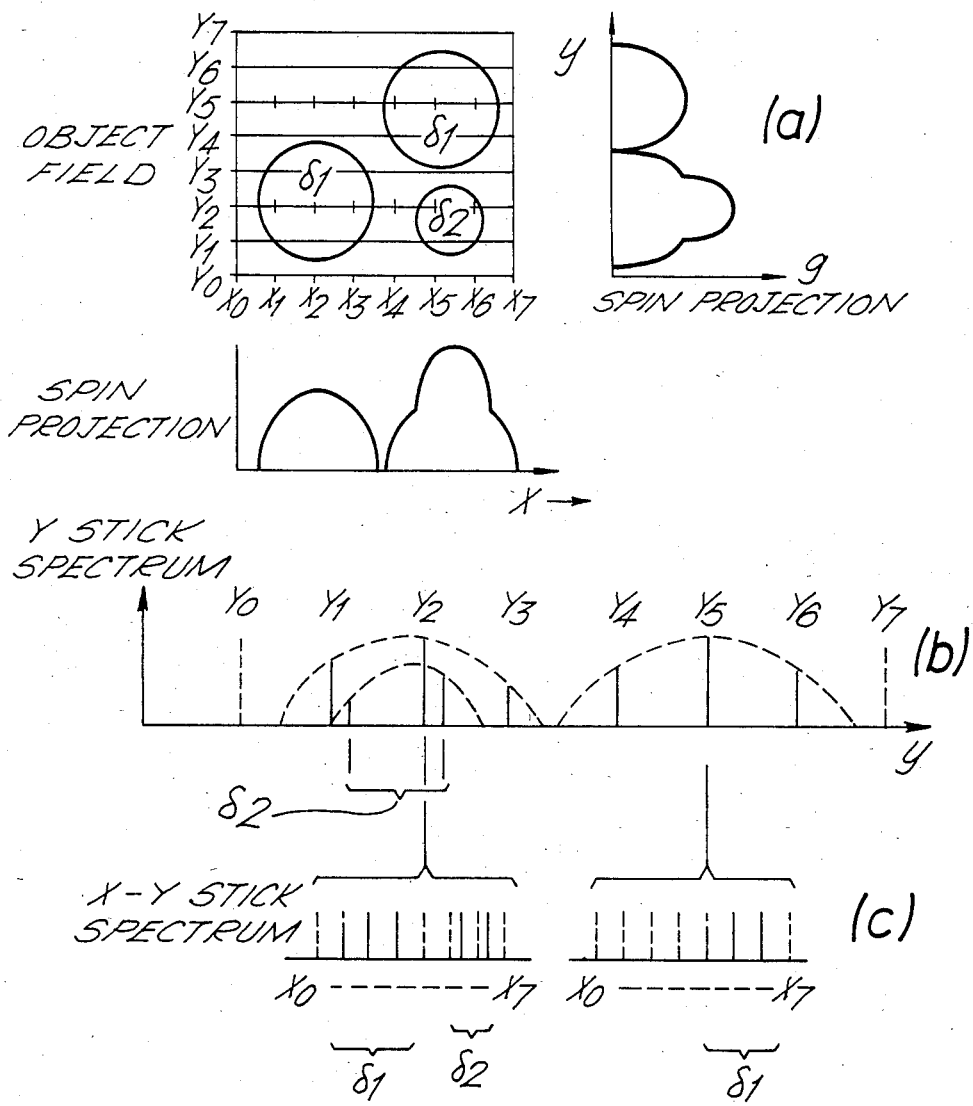
FIGS. 12a, 12b and 12c illustrate the data obtained during an experiment using the method of FIG. 11.

Considering now the two dimensional object field of FIG. 12a. This contains three discs of homogenously distributed material and having two chemical shifts $\delta_1$ and $\delta_2$ as shown. FIG. 12a also shows the continuous one dimensional projection spectra along the two principal axes. If now $G_y$ is modulated ($G_x = 0$) we obtain six y sticks from the $\delta_1$ shifted zones and two smaller sticks arising from the $\delta_2$ shifted region, as shown in FIG. 12b. The stick spectrum profiles are semi-elliptical in all cases, since the objects are homogenous discs. If now the $G_x$ modulation is added, we obtain a splitting of each y stick into a multiplet as shown for two cases $y_2$ and $y_5$ in FIG. 12c. In the case described, there are in general 64 lines in this spectrum. It is important to realize that as sketched, it is rather assumed that the lines arising from $\delta_1$ are used as the reference. That is to say, we have arranged that $\delta_1$ falls in the middle of the δ shift range. However, it is clear that this is arbitrary and indeed one might wish in general to introduce a third shift purely as the reference compound.

The spectrum of FIG. 12c is in a form which is readily interpretable by stacking the 16 point data sets in the form of a third angle projection. This is illustrated in FIG. 13a for the object of FIG. 12a. In this form, it is immediately obvious that we have at our disposal the quantity of material and its chemical shift for every specified point in the x,y plane. The three dimensional plot can also yield other useful information. For example projection along the δ axis gives the spin density map FIG. 13b. Projection along the x-axis gives the y−δ density plot, FIG. 13c, which is the result obtained in Section 2 without $G_x$. In a similar manner projection along the y-axis gives the x−δ density plot, FIG. 13d.

While discussion has so far been restricted to chemical shift, it will be clear that the scheme described could be used to map the field distribution for a magnet. In this case, a material with no chemical shift distribution would be used. Such a single resonance compound should give single thin line streak patterns in the δ-x and δ-y projection plots. However, if there are magnetic field inhomogeneities, this will broaden and bend the streak patterns revealing the degree and position of such inhomogeneities.

An interesting consequence of this new mapping procedure is that for protons, where chemical shifts are small anyway, provided some space exists in the δ dimension to accomodate static field inhomogeneities, the x,y projection or image will contain no inhomogeneity artefacts. Thus we have a way of removing undesirable spatial inhomogeneities in the static magnetic field. One consequence of this is that EP imaging may be satisfactorily performed in poorer magnets. However, the price paid is an increase in both the $G_x$ and $G_y$ gradients.

The ability to study material which produces localized magnetic inhomogeneities also exists. Finely divided iron and encapsulated iron and other magnetic materials may be orally administered. The passage of these materials can now be easily monitored in time course studies. Bulk susceptibility effects of haemoglobin and other magnetic materials in the liver may also be observable by these means.

It will be appreciated that the method according to the inventions may readily be carried out by appropriately programming a known form of computer controlled NMR apparatus, for example, an apparatus as described in the UK Patent Specification No. 1,578,910 or No. 2,056,078.

I claim:

1. A method of investigating a body by NMR comprising the steps of: exciting resonance in a selected slice of the body; subsequently applying a magnetic field to said body having first and second gradients in different directions in said slice, both said gradients being periodically reversed at regular intervals with their periods of reversal being coordinated such that the period of reversal of one of said gradients is a multiple of the period of reversal of the other of said gradients; detecting the free induction decay signals occurring when said gradients are applied; and processing the detected signals to retrieve data.

2. A method of investigating a body by NMR according to claim 1 wherein said steps are executed a second time with one of the gradients starting with opposite polarity with respect to that obtaining in the first execution of said steps.

3. A method according to claim 1 wherein the respective directions of the two gradients are at right angles.

4. A method according to claim 1 wherein excitation of resonance in said slice is effected by application of a selective RF pulse in the presence of a first magnetic field gradient pulse followed by a nonselective 180° RF pulse and a further field gradient pulse of the same polarity as the first field gradient pulse.

5. A method of investigating a body by NMR according to claim 1 wherein said steps are carried out four times with a respective different combination of the starting polarities of said first and second gradients each time said steps are carried out.

* * * * *

UNITED STATES PATENT AND TRADEMARK OFFICE
CERTIFICATE OF CORRECTION

PATENT NO. : 4,588,948
DATED : May 13, 1986
INVENTOR(S) : Peter Mansfield

It is certified that error appears in the above-identified patent and that said Letters Patent is hereby corrected as shown below:

Column 5, line 43, "adJacent" should be --adjacent--;
Column 6, line 59, "lhickness" should be --thickness--;
Column 8, line 36, "sumation" should be --summation--;
Column 8, line 40, insert:
    "The inverse Fourier transform of Equation (16) is"
Column 9, line 49, "additioal" should be --additional--;
Column 10, line 59, "objected" should be --object--;
Column 12, line 5, "spetrum" should be --spectrum--.

Signed and Sealed this

Fourth Day of November, 1986

[SEAL]

Attest:

DONALD J. QUIGG

Attesting Officer

Commissioner of Patents and Trademarks